(12) United States Patent
Bai

(10) Patent No.: US 11,106,091 B2
(45) Date of Patent: Aug. 31, 2021

(54) DISPLAY SUBSTRATE, METHOD FOR MANUFACTURING THE SAME, DISPLAY PANEL, AND METHOD FOR MANUFACTURING THE SAME

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Xuefei Bai, Beijing (CN)

(73) Assignees: BOE TECHNOLOGY GROUP CO., LTD., Beijing (CN); ORDOS YUANSHENG OPTOELECTRONICS CO., LTD, Ordos (CN)

(*) Notice: Subject to any disclaimer, the term of this patent is extended or adjusted under 35 U.S.C. 154(b) by 197 days.

(21) Appl. No.: 16/375,113

(22) Filed: Apr. 4, 2019

(65) Prior Publication Data
US 2019/0227360 A1    Jul. 25, 2019

Related U.S. Application Data

(62) Division of application No. 15/145,243, filed on May 3, 2016, now Pat. No. 10,295,868.

(30) Foreign Application Priority Data
Aug. 3, 2015    (CN) .......................... 201510483076.9

(51) Int. Cl.
*H01L 51/52* (2006.01)
*G02F 1/1339* (2006.01)

(52) U.S. Cl.
CPC ........ *G02F 1/1339* (2013.01); *H01L 51/5246* (2013.01)

(58) Field of Classification Search
CPC .......................... G02F 1/1339; H01L 51/5246
See application file for complete search history.

(56) References Cited

U.S. PATENT DOCUMENTS

2007/0153224 A1    7/2007 Jung
2007/0236644 A1*   10/2007 Wu .................. G02F 1/133351
                                                      349/153
2008/0088752 A1    4/2008 Kim et al.
(Continued)

FOREIGN PATENT DOCUMENTS

CN    2632849 Y    8/2004
CN    1632547 A    6/2005
(Continued)

OTHER PUBLICATIONS

The First Chinese Office Action dated Aug. 14, 2017; Appln 201510483076.9.
(Continued)

*Primary Examiner* — Jeffry H Aftergut

(57) ABSTRACT

A display substrate, a method for manufacturing thereof, a display panel and a method for manufacturing thereof are disclosed. The display substrate includes a display region and a sealing region surrounding the display region. A plurality of through holes are formed within the sealing region of the display substrate.

11 Claims, 3 Drawing Sheets

(56) References Cited

U.S. PATENT DOCUMENTS

| | | | | |
|---|---|---|---|---|
| 2009/0303427 | A1* | 12/2009 | Kondo | G02F 1/1339 |
| | | | | 349/153 |
| 2011/0069271 | A1 | 3/2011 | Chu et al. | |
| 2012/0002145 | A1* | 1/2012 | Lee | G02F 1/136204 |
| | | | | 349/106 |
| 2012/0062981 | A1* | 3/2012 | Komatsu | G02F 1/167 |
| | | | | 359/296 |
| 2017/0176788 | A1* | 6/2017 | Fukuoka | G02F 1/13394 |

FOREIGN PATENT DOCUMENTS

| | | |
|---|---|---|
| CN | 101551556 A | 10/2009 |
| CN | 103102075 A | 5/2013 |

OTHER PUBLICATIONS

The Third Chinese Office Action dated Sep. 21, 2018; Appln. 201510483076.9.
USPTO RR dated Apr. 6, 2018 in connection with U.S. Appl. No. 15/145,243.
USPTO NFOA dated Aug. 6, 2018 in connection with U.S. Appl. No. 15/145,243.
USPTO NOA mailed Jan. 9, 2019 in connection with U.S. Appl. No. 15/145,243.

* cited by examiner

DISPLAY SUBSTRATE, METHOD FOR MANUFACTURING THE SAME, DISPLAY PANEL, AND METHOD FOR MANUFACTURING THE SAME

TECHNICAL FIELD

Embodiments of the present disclosure relates to a display substrate, a method for manufacturing the same, a display panel, and a method for manufacturing the same.

BACKGROUND

A display panel generally comprises a back plate and a cover plate, which are assembled together by a sealant. Before the assembling process, the sealant is applied onto four edges of the cover plate and cured. During the assembling process, the cured sealant is melted by laser irradiating, and then the melted sealant spreads to the surface of the back plate, such that the back plate and the cover plate are adhered to each other.

The adhesion strength between the cover plate and the back plate is decreased, because of the uneven surface of the cured sealant before laser irradiating.

SUMMARY

In first aspect of the present disclosure, there is provided a display substrate, which comprises a display region and a sealing region surrounding the display region, wherein a plurality of through holes are formed within the sealing region of the display substrate.

In second aspect of the present disclosure, there is provided a method for manufacturing a display substrate, which comprises: providing a base substrate, the base substrate comprising a first portion corresponding to a display region of the display substrate and a second portion corresponding to a sealing region of the display substrate; forming a plurality of through holes within the second portion of the base substrate.

In third aspect of the present disclosure, there is provided a method for manufacturing a display panel, which comprises: providing a sealant within a sealing region of a cover plate and curing the sealant; assembling the cover plate and the display substrate of claim 1 to make the sealant on the cover plate overlap the plurality of through holes within the sealing region of display substrate; heating both of the sealing regions to melt the sealant at a first temperature, and the melted sealant is filled into the plurality of through holes.

In fourth aspect of the present disclosure, there is provided a display panel, which comprises the above display substrate

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
FIG. 1 is a structural schematic view illustrating a display panel.

As illustrated in FIG. 1, a display panel, which is formed by a back plate 12 and a cover plate 11 assembled together, comprises a display region and a sealing region C. A sealant 13 is filled within the sealing region C to provide adhesion between the back plate 12 and the cover plate 11.

Figure 2A:
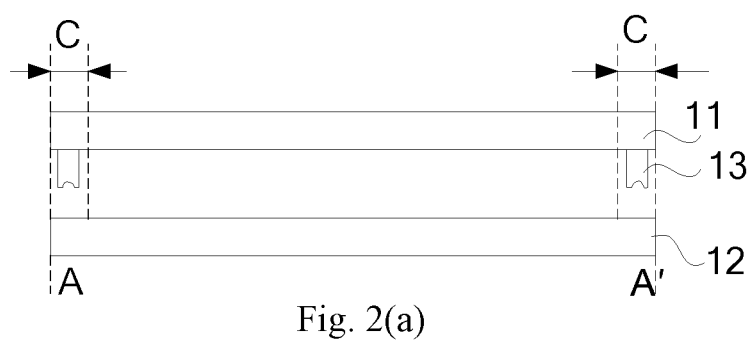
FIG. 2(*a*) and FIG. 2(*b*) are sectional views illustrating the display panel in FIG. 1.
Figure 2B:
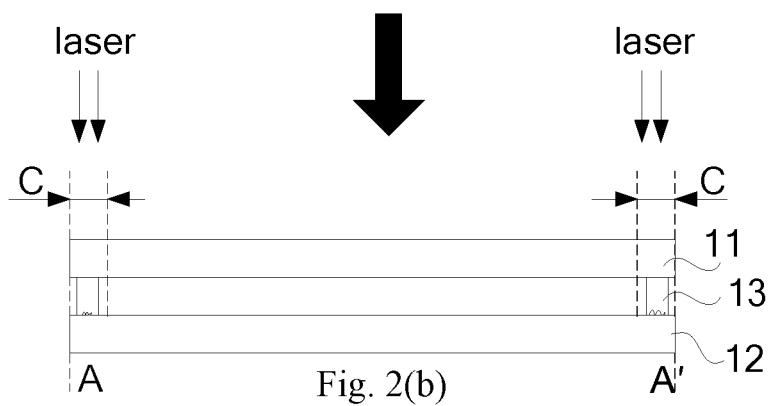

Firstly, as illustrated in FIG. 2(*a*), before the assembling process, the sealant 13 is applied onto the sealing region C of the cover plate 11 and cured. Then, the cover plate 11 is assembled with the back plate to form a cell. Next, as illustrated in FIG. 2(*a*), the sealant 13, which melted by a laser irradiation, spreads to the surface of the back plate 12 and then cured. Because the surface morphology is rugged, gases generated during laser irradiation accumulates in the sealant 13, accordingly, the adhesion strength between the sealant 13 and the back plate 12 is decreased.

To make the objects, the technical solutions and the advantages of the embodiments of the present disclosure more apparent, the embodiments of the present disclosure will be described clearly and completely hereinafter in conjunction with the drawings. Obviously, the followings are merely a part of, rather all of, the embodiments of the present disclosure. Based on the following embodiments, all the other embodiments obtained by a person skilled in the art without any creative effort also fall in the scope of the present disclosure.

Figure 3:
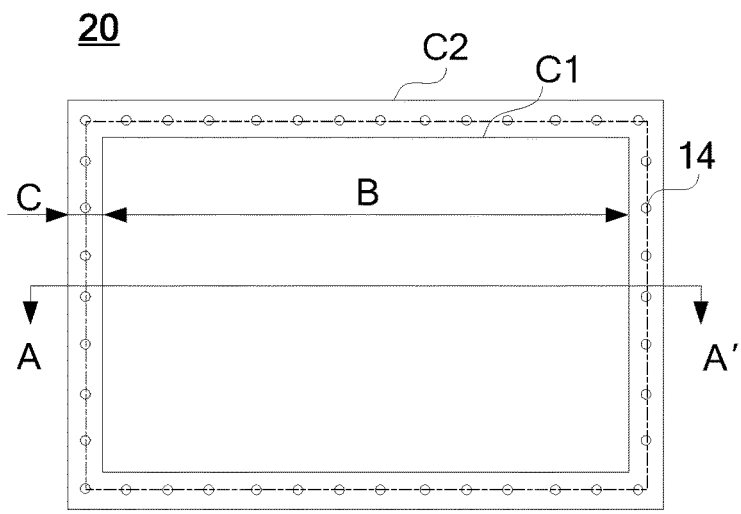
FIG. 3 is a structural schematic view illustrating a display substrate according to an embodiment of the present disclosure.
Figure 4:
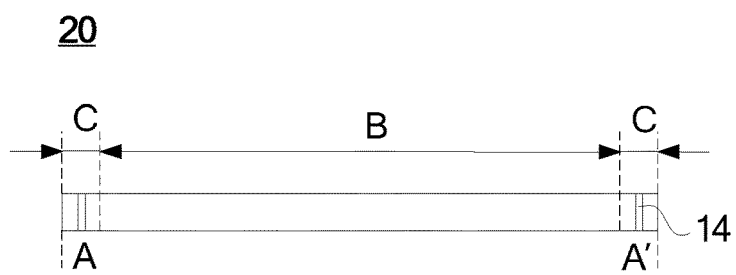
FIG. 4 is a sectional view of the display panel in FIG. 3 along A-A' direction.

As illustrated in FIG. 3 and FIG. 4, an embodiment of the present disclosure provides a display substrate. The display substrate comprises a display region B and a sealing region C surrounding the display region B. A plurality of through holes are formed in the sealing region C, wherein "a plurality of" refers to two or more.

According to the display substrate provided by the embodiment of the present disclosure, the adhesive interface quality and the sealing effect between the sealant and display substrate are increased due to the through holes in sealing region, by which the gases in the sealant can be exhausted.

It should be noted that depending on types of the display device to be formed in the display region, the display panel may be an array substrate or a color filter substrate of a TFT-LCD (Thin Film Transistor-Liquid Crystal Display), and also may be an array substrate or a sealing substrate of an OLED (Organic Light Emitting Display).

As illustrated in FIG. 3, in at least some embodiments of the present disclosure, a plurality of through holes 14 are evenly distributed at equal intervals so as to ensure a uniform sealing strength of the sealing region of the display substrate. The shape of the through holes could be arbitrarily, such as round, square, and so on, or may be of irregular shape. The embodiments of the present disclosure will be described by taking an example of the through holes in round shape.

In at least some embodiments of the present disclosure, the sealing region is defined by an inner boundary and an outer boundary. The through holes are located at the center between the inner boundary and the outer boundary. As illustrated in FIG. 3, the plurality of through holes 14 are disposed along the center line (illustrated as dotted line) between the inner boundary C1 and the outer boundary C2 to ensure that the sealant overlaps the through holes during the assembling process.

For example, the shape of the through holes is round, and the diameter of the holes is not more than 300 μm. The diameter of the through holes could be adjusted depending on the dimension of the display substrate.

In at least some embodiments of the present disclosure, at least some through holes are filled with a filler. Firstly, it can increase the supporting strength of the display substrate. Secondly, it can avoid the failure to fill the sealant into the through holes caused by plugging the through holes with other materials when forming the other display devices within the display region. After forming the through holes, the filler, for example with a low melting point, is filled into the through holes; therefore, the melted filler can flow out from the through holes easily while heating the sealing region. In other embodiments, all the through holes are filled with the filler.

Another embodiment of the present disclosure provides a method for manufacturing the display substrate, comprises:

Step 101: providing a base substrate which comprises a first portion corresponding to a display region of the display substrate and a second portion corresponding to a sealing region of the display substrate;

Step 102: forming a plurality of through holes in the second portion of the base substrate.

For example, the through holes are formed by a laser ablation or mechanical drilling process. However, the embodiments of the present disclosure are not particularly limited thereto.

In at least some embodiments of the present disclosure, after forming a plurality of the through holes in the second portion of the base substrate, the method further comprises: filling the fillers into at least some the through holes. The fillers can be chosen from different materials, depending on the different function of the fillers in the through holes. The embodiment of the present disclosure will describe an example of the fillers with the melting point lower than the melting point of the sealant for illustrative purposes.

Figure 6:
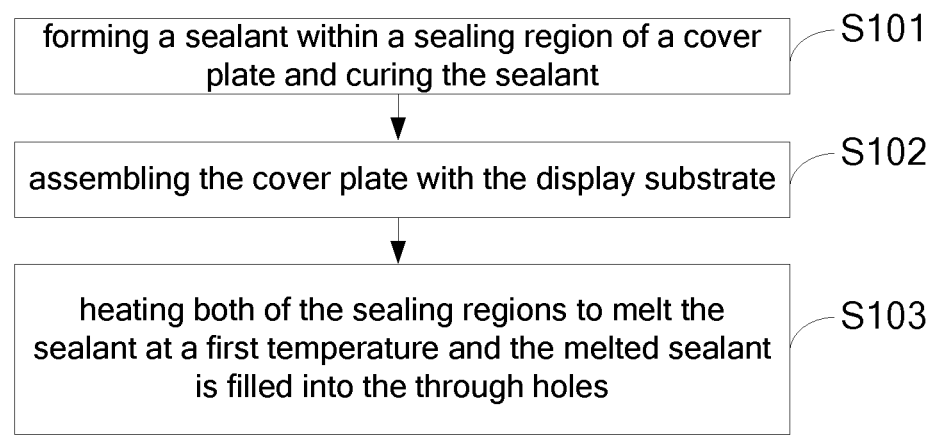
FIG. 6 is a flow chart illustrating a method for manufacturing a display panel according an embodiment of the present disclosure.

As illustrated in FIG. 6, another embodiment of the present disclosure provides a method for manufacturing the display panel comprises:

Step 101: forming a sealant within a sealing region of a cover plate and curing the sealant;

Step 102: assembling the cover plate with the display substrate provided by the embodiment of the present disclosure. For example, referring to FIG. 5, the sealing region C of the cover plate 11 is disposed opposite to the sealing region C of the display substrate. The sealant 13 of the cover plate 11 overlaps the through holes 14 of the sealing region C of the display substrate 20.

Step 103: heating both of the sealing regions to melt the sealant at a first temperature and the melted sealant is filled into the through holes.

In at least some embodiment of the present disclosure, some of through holes within the sealing region are filled with the filler, and the melting point of the filler is lower than the melting point of the sealant. For example, the sealant is a mixture of frit powder and an adhesion agent mixed in a certain ratio. As an example, the fit powder is formed by mixing glass powder and inorganic powder (such as $SiO_2$, $B_2O_3$, $P_2O_5$, $V_2O_3$, $GeO_2$); and the adhesion agent is formed by mixing organic adhesion agent (such as ethyl cellulose or nitrocellulose) and organic solvent (such as alcohol, benzene or ketone). For example, the melting point of the sealant is approximately 400° C., and the filler is a hot-melt adhesive with low melting point (100° C.<T<250° C.), such as hot-melt adhesive, resin or rubber. When the sealing region is heated, the filler is melted prior to the sealant and flows out from the through holes, because the melting point of the filler is lower than the melting point of the sealant. The gas in the sealant can be exhausted through the through holes. Finally, the sealant is filled into the through holes. Apparently, the materials of the sealant and the filler are not limited to above; the present disclosure is described by taking the above example for illustrative purpose.

During the formation of the other display devices within the display region of the display substrate, the through holes may possibly be plugged with the material used for forming the display devices. Therefore, after forming the through holes, the material with the melting point lower than the melting point of the sealant is filled into the through holes so as to avoid plugging the through holes. In this way, during the assembling process, the filler can be melted and flow out from the through holes prior to the sealant, such that the gas in the sealant can be exhausted through the through holes.

In at least some embodiments of the present disclosure, before the step 102, the method further comprises: providing the display substrate above a platform and suspending the sealing region of the display substrate above the platform.

In at least some embodiments of the present disclosure, the step 102 comprises: attaching the cover plate to the display substrate on the platform.

The sealing region of the display substrate is suspended on the platform so that the filler or the sealant is easily to flow out through the through holes.

The embodiment is described by making the sealing region suspended for illustrative purpose, in other embodiments, the exhaustion of gas also may be implemented in various different ways.

Figure 5:
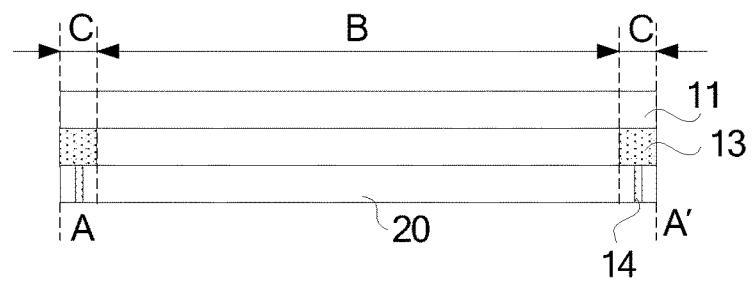
FIG. 5 is a structural schematic view illustrating a display panel according to an embodiment of the present disclosure.

As illustrated in FIG. 5, another embodiment of the present disclosure provides a display panel comprising any one of the display substrate 20 provided by the embodiments of the present disclosure and the cover plate 11. As an example, the sealant 13 is disposed within the sealing regions of the display substrate 20 and of the cover plate 11; the sealant 13 is filled into the through holes 14 within the sealing region C of the display substrate 20.

The embodiments of the present disclosure provide a display substrate and the method for manufacturing thereof, display panel and the method for manufacturing thereof. During sealing process, the gas in the sealant can be exhausted by the through holes, which are formed within the sealing region of the display substrate, so as to increase the adhesive interface quality and the sealing effect.

What is described above is related to the illustrative embodiments of the disclosure only and not limitative to the scope of the disclosure; the scopes of the disclosure are defined by the accompanying claims.

The present application claims the priority of Chinese patent application No. 201510483076.9 filed on Aug. 3, 2015, the disclosure of which is incorporated herein by reference in its entirety.

What is claimed is:

1. A display substrate, comprising a display region and a sealing region surrounding the display region, wherein a plurality of through holes are formed within the sealing region of the display substrate, and each of the plurality of through holes penetrates through the display substrate.

2. The display substrate of claim 1, wherein the plurality of through holes are evenly distributed within the sealing region.

3. The display substrate of claim 2, wherein the sealing region is defined by an inner boundary and an outer boundary, the plurality of through holes are disposed along a central line between the inner boundary and the outer boundary.

4. The display substrate of claim 1, wherein a shape of the through holes are round, a diameter of the through holes is less than or equal to 300 μm.

5. The display substrate of claim 1, wherein at least a part of the through holes are filled with a filler.

6. The display substrate of claim 5, wherein a melting point of the filler is lower than that of a sealant.

7. A method for manufacturing a display substrate, comprising:

providing a base substrate, the base substrate comprising a first portion corresponding to a display region of the display substrate and a second portion corresponding to a sealing region of the display substrate;

forming a plurality of through holes within the second portion of the base substrate, wherein each of the plurality of through holes penetrates through the base substrate.

8. The method of claim 7, wherein after forming a plurality of through holes, the method further comprises: filling a filler into at least a part of the through holes.

9. The method of claim 7, wherein a melting point of the filler is lower than that of a sealant.

10. A display panel, comprising the display substrate of claim 1.

11. The display panel of claim 10, further comprising a cover plate, wherein the cover plate comprises a sealing region within which a sealant is provided, the sealant is filled into the plurality of the through holes within the sealing region of display substrate.

* * * * *

UNITED STATES PATENT AND TRADEMARK OFFICE
CERTIFICATE OF CORRECTION

PATENT NO. : 11,106,091 B2
APPLICATION NO. : 16/375113
DATED : August 31, 2021
INVENTOR(S) : Xuefei Bai Page 1 of 1

It is certified that error appears in the above-identified patent and that said Letters Patent is hereby corrected as shown below:

On the Title Page

Item (73) Assignees:
BOE TECHNOLOGY GROUP CO., LTD., Beijing (CN)
ORDOS YUANSHENG OPTOELECTRONICS CO., LTD, Ordos (CN)

Is changed to:
BOE TECHNOLOGY GROUP CO., LTD., Beijing (CN)
ORDOS YUANSHENG OPTOELECTRONICS CO., LTD., Ordos (CN)

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*